United States Patent [19]

Saldell

[11] Patent Number: 5,408,688
[45] Date of Patent: Apr. 18, 1995

[54] METHOD AND A DEVICE PERTAINING TO AN ELECTRO-MECHANICALLY CONTROLLED RESONANCE MODULE

[75] Inventor: Ulf Saldell, Osterskar, Sweden

[73] Assignee: Allgon AB, Akersberga, Sweden

[21] Appl. No.: 687,888

[22] PCT Filed: Nov. 30, 1989

[86] PCT No.: PCT/SE89/00705
§ 371 Date: Jun. 15, 1992
§ 102(e) Date: Jun. 15, 1992

[87] PCT Pub. No.: WO90/06627
PCT Pub. Date: Jun. 14, 1990

[30] Foreign Application Priority Data

Dec. 2, 1988 [SE] Sweden .................. 8804374
Oct. 6, 1989 [SE] Sweden .................. 8903298

[51] Int. Cl.$^6$ .................... H03J 7/16; H03L 7/06
[52] U.S. Cl. ........................... 455/77; 455/125; 455/193.2; 455/195.1; 333/232
[58] Field of Search ............... 455/121, 123, 124, 125, 455/129, 170.1, 178.1, 193.2, 195.1, 77, 80, 338; 333/232, 233, 17

[56] References Cited

U.S. PATENT DOCUMENTS

| | | |
|---|---|---|
| 3,271,684 | 9/1966 | Simon . |
| 3,293,572 | 12/1966 | Smith .................. 333/17 |
| 3,715,690 | 2/1973 | Young et al. .......... 455/338 |
| 4,097,823 | 6/1978 | Jerinic et al. ......... 455/124 |
| 4,726,071 | 2/1988 | Jachowski . |

Primary Examiner—Reinhard J. Eisenzopf
Assistant Examiner—Thanh C. Le
Attorney, Agent, or Firm—Pollock, Vande Sande & Priddy

[57] ABSTRACT

Method and apparatus in mobile telephone system including base stations with a plurality of resonance modules, for separately adjusting each resonance module to its own frequency for receiving and expediting telephone signals at this frequency. In each resonance module, tuning is controlled to its given resonance position in relation to the frequency of the incoming signal, by an electromechanical drive which is connected for obtaining drive voltage by phase comparison. The drive voltage passes solely when two input signals differ in phase. When both signals are in phase, the drive voltage is zero, the drive then being stationary and the resonance module being adjusted in resonance to the input signal.

11 Claims, 5 Drawing Sheets

METHOD AND A DEVICE PERTAINING TO AN ELECTRO-MECHANICALLY CONTROLLED RESONANCE MODULE

FIELD OF THE INVENTION

The present invention relates to a method, in mobile telephone systems comprising base stations with a plurality of resonance modules (cavities), for separately adjusting each resonance module to its own frequency for receiving and expediting telephone signals on such frequency, a tuning means in each module being guided to its given resonance mode in relation to the frequency of the incoming signal. The invention also relates to apparatus for carrying out the method, as well as adjusting means for guiding the tuning means.

BACKGROUND OF THE INVENTION

In such mobile telephone systems it is already known to arrange a plurality of resonance modules at the base stations, each of these module being tunable to a specific frequency. In the past, the adjustment of the resonance modules was carried out manually, although systems for automatic adjustment are also known.

SUMMARY OF THE INVENTION

The present invention has the object of improving the automatic adjustment and, inter alia, to cause a part of the switching circuit to function as a selective amplitude detector, with the result that the apparatus will not be responsive to signals from neighboring channels. With the aid of the circuits and the electro-mechanical adjusting means, very rapid setting and fine adjustment of the resonance module is achieved. The rapidity of the setting means is in itself necessary in telephone systems, and was perhaps afforded by earlier known setting means as well, but the setting means in accordance with the present invention is much more reliable than the prior art setting means, and has a long life.

BRIEF DESCRIPTION OF THE DRAWINGS

The invention will now be described in more detail and with reference to the accompanying drawings in which.

DESCRIPTION OF THE PREFERRED EMBODIMENT

Figure 1:
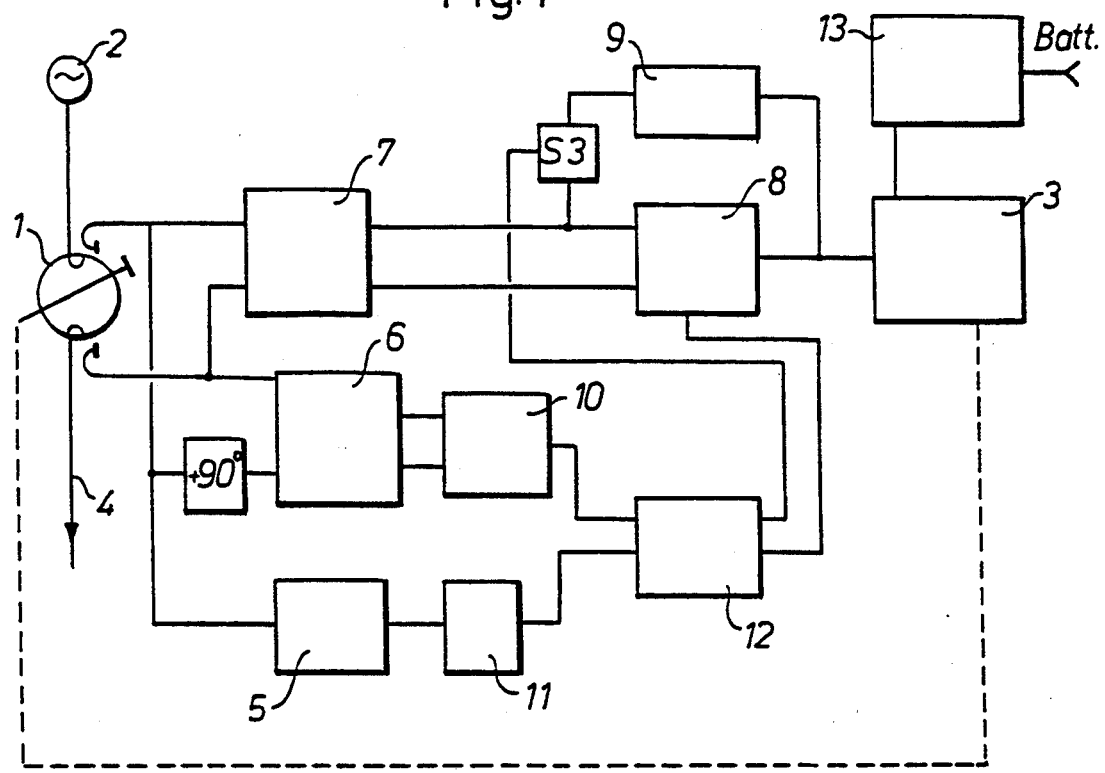
FIG. 1 is a block diagram of units included in the system for the adjustment of the resonance modules.

The method of controlling the setting means for the resonance module in accordance with the invention will first be summarized without specific reference to the drawing figures.

A measuring signal is taken out of either side of the resonance module, one signal being taken out before the module and the other signal after it. Hereinafter the former signal will be designated as "reference signal" and the latter signal as "measuring signal". A first detector senses the signal and delivers a voltage. If the associated antenna is not given any reference signal, no such signal can be applied to the resonance module and there is thus no voltage either. If a reference signal comes to the resonance module, a measuring signal always occurs sooner or later on the other side of the module, and this signal is sent by a second detector. The detector has a control circuit, which is then switched to a search mode, signifying that the module tuning means performs a movement in the module, and an output signal is sent. When the reference signal and the measuring signal have the same phase angle, a maximum potential controlled by the second detector is obtained between two applied voltages. When there is no measuring signal, the applied voltage has no potential difference. A third detector is arranged for measuring the phase difference between the reference signal and the measuring signal, preferably such that either the reference signal or the measurement signal is phase shifted 90° in relation to the other of these signals so that an auxiliary signal is obtained. A voltage fed to the circuit will change in size and strength, but due to the phase difference this voltage will be zero in case there is 90° phase difference between these signals. There will then be phase agreement between the reference signal and measurement signal. By searching specifically for a zero rather than a maximum point in the voltage differences, it is possible to obtain a more exact position by achieving a phase difference between the reference signal and measuring signal, and using the auxiliary signal thus generated for finding out when phase equality is present. A phase error between the reference and measuring signals gives rise to a proportionally positive or negative error voltage, which after suitable amplification is used to control the adjusting means so that the error moves towards zero.

The apparatus in accordance with the invention is illustrated schematically with the aid of a block diagram in FIG. 1. The base station has a plurality of resonance modules. Each module has its own electrical control circuit and its own adjusting means. FIG. 1 is illustrates the resonance module 1 with a setting means 3 which reciprocates to and fro a tuning means in the resonance module until the latter means has reached the position where resonance occurs in the module between an input signal and an output signal. The input signal is thus a signal picked up by an antenna to be taken to a telephone for establishing communication. Hereinafter, the incoming signal is designated "reference signal" and reaches the resonance module via an antenna. When the tuning means has set the resonance module to its resonance state, the output signal from it is equal in frequency with the input signal and can be sent further for telecommunication. Three detectors are arranged for giving signals for operating the setting means 3 via the amplified signals. The first detector 5 senses the reference signal, and if there is no such signal, no voltage will be sent, signifying that no signal reaches the adjusting means 3. The detector 5 is connected to a comparator 11, a logic circuit 12 and to both an error amplifier 8 and a search amplifier 9. A second detector 6 is designated "amplitude detector". This detector obtains signals in the form of reference signals and measuring signals, i.e., the signals taken out before and after the resonance module. The signals from the amplitude detector pass via a comparator and a logical circuit to the search amplifier 9. A third detector 7 is designated phase detector, and similarly obtains signals in the form of the reference signal and measurement signal, and these signals are compared and passed to the error amplifier 8. The voltage supply to the apparatus takes place from a battery via a voltage regulator 13.

Figure 2:
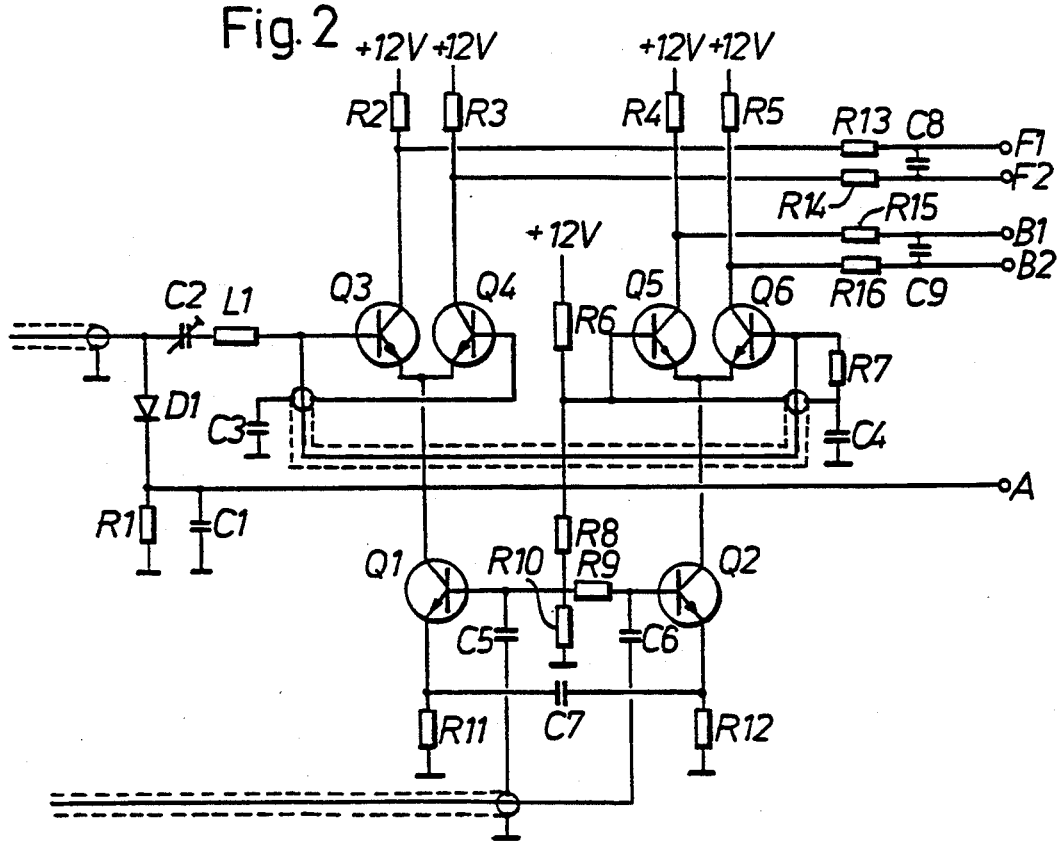
FIG. 2 is a terminal diagram of three detectors included in the system.
Figure 3:
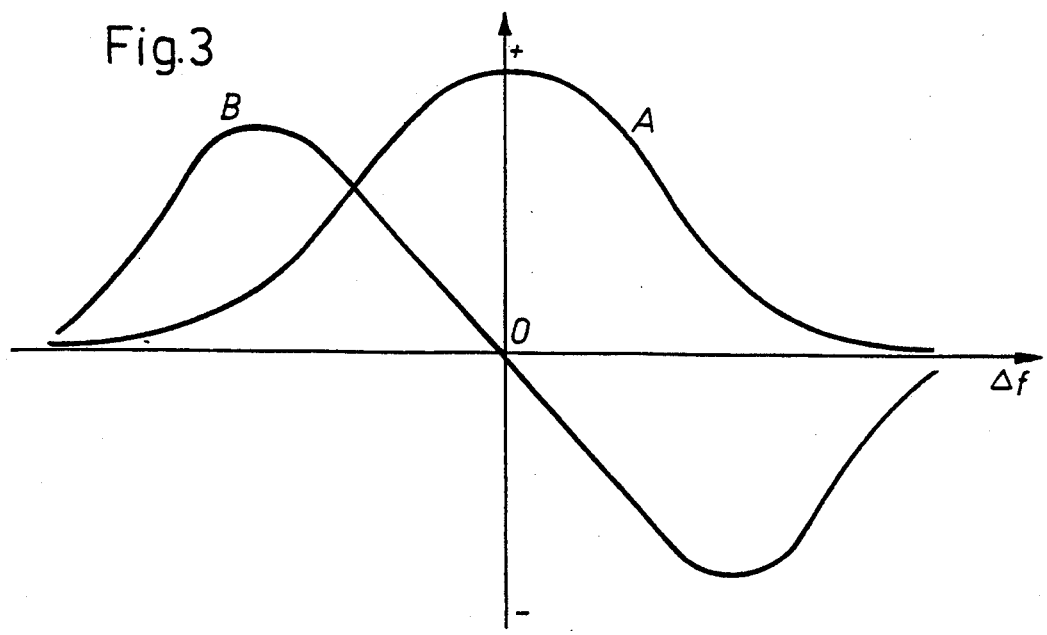
FIG. 3 is a graph of the phase setting.

The function of the three detectors will now be described with reference to FIGS. 2 and 3. In the circuit diagram of FIG. 2, it will be seen that three detectors are formed around the diode $D_1$ and the transistors $Q_1 - Q_6$, these detectors being necessary for controlling the associated resonance module in all situations to obtain the resonance frequency at which its transmitter operates. Two signals are required: a reference signal, which is taken out from a point directly before the resonance module, possibly via a direction coupler. A suitable signal level can be said to be about 1 mW. A second measuring signal is taken down from a point after the resonance module, but before its connection with the other modules in the station. A direction coupler is necessary so that intermixture with other channels will be as small as possible. A suitable level for the measuring signal is also about 1 mW.

If the transmitter is shut down, no searching or frequency adjustment of the resonance module is carried out. The first detector comprises $D_1$, $R_1$ and $C_1$ and gives a voltage at point A of a minimum of 50 mW when the transmitter is in operation. When the transmitter is closed down the voltage is 0 volt. A time constant $R_1$, $C_1$ is selected such that an indication of interrupted transmission can take place for less than 0.5 ms.

The second detector includes the transistors $Q_2$, $Q_5$ and $Q_6$.

When transmission is in progress, but there is no measuring signal, the control circuit must be connected in the search mode. Sooner or later a measuring signal will be detected by a detector 2. The output signal will be between points $B_1$ and $B_2$. This signal is used to stop the search sequence and to initiate a fine adjustment of the resonance module, i.e., its cavity resonance frequency. The illustrated circuit functions as a selective amplitude detector and is therefore not responsive to the signals of the neighboring channels. A suitable working point for the transistors $Q_1-Q_6$ is adjusted with the aid of the resistances $R_6$, $R_8$, $R_{10}$, $R_{11}$ and $R_{12}$. The illustrated capacitors $C_3$, $C_4$ and $C_5$ are effective HF decoupling capacitors. The measuring signal is supplied to transistor $Q_2$ and arrives at its base via the coupling capacitor $C_6$. The resistor $R_g$ terminates the feed cable leading the measuring signal with the right impedance to the transistor $Q_1$. The measuring signal is regained in an amplified state at the collector of the transistor $Q_2$. This collector current is divided between $R_4$ and $R_5$ depending on how the transistors $Q_5$ and $Q_6$ are controlled. The reference signal passes the filter $C_2$. $L_1$ and is taken via a short cable to the base of the transistor $Q_6$. The resistor $R_7$ terminates the cable with the right impedance. The reference signal conducts the transistors $Q_5$ and $Q_6$ alternatively. If both the reference signal and the measuring signal have the same phase angle, all current pulses through the transistor $Q_2$ will be connected to the resistor $R_5$, with the result that $B_1$ will be given a high potential while $B_2$ will be given a low potential.

As will be understood from the foregoing description, an equal voltage of $+12$ volt will be fed across the parallel resistors $R_4$ and $R_5$. If there is no measuring signal, the transistors $Q_5$ and $Q_6$ will conduct the same current alternatingly and the voltage drops across the resistors $R_4$ and $R_5$ will be equal. There will not be any voltage difference between $B_1$ and $B_2$ either. This is illustrated in FIG. 3 by graph A.

The resistors $R_{15}$ and $R_{16}$, as well as the capacitor $C_9$, form a lowpass filter which removes all HF remnants from the detector circuit. For proper functioning, the requirement of a correct phase angle between the reference signal and the measuring signal is important. This is arranged in the first place by giving cables for the respective signals a specific length. Fine adjustment then takes place with the capacitor $C_2$ which, with the aid of $L_1$, can turn the phase about $+45°$.

Accordingly, when the search according to the above has been stopped with the aid of the detector 2, a third detector takes over and controls the tuning means of the resonance module so that the resonance frequency always agrees with the transmitter signal and so that its possible damping is minimized. This third detector is formed by the transistors $Q_1$, $Q_3$ and $Q_4$, which mainly measure the phase difference between the reference and measuring signals. The graph B in FIG. 3 illustrates the phase sequence as a function of the frequency. Correct tuning takes place when the voltage difference between $F_1$ and $F_2$ is zero. The working point for the transistors in the third detector is determined in the same way and by the same components as for the detector 2. The balanced transistor pair $Q_3$ and $Q_4$ is fed with the reference signal, which is here arranged to be at 90° in front of the signal in the detector 2. The cable between the detectors is a quarter of a wavelength long, which gives a phase shift of 90°. The measuring signal, which is amplified in the transistor $Q_2$, is connected via the capacitor $C_7$ and transistor $Q_1$ and appears at its collector shifted 180° in relation to its phase position at the transistor $Q_2$. The current pulses from the transistor $Q_1$ are divided equally by the 90° phase difference between the transistor $Q_3$ and the transistor $Q_4$. As a result, the voltage drops across the resistors $R_2$ and $R_3$ will be equal and the output voltage between $F_1$ and $F_2$ will be zero. It will be understood that, in the same way as for the signals at $B_1$ and $B_2$, the parallel resistors $R_1$ and $R_2$ are each fed with equal voltages of $+12$ volt. The resistors $R_{13}$ and $R_{14}$ as well as the capacitor $C_8$ take away the residues of HF and interference signals caused by the neighboring channels. A phase error between the reference and measuring signals gives rise to a proportional positive or negative error voltage, which, after suitable amplification, is used to control the tuning means in the resonance module so that the error or difference in phase moves towards zero. The capacitor $C_2$ is used in practice to adjust the entire system to obtain the best tuning result.

Figure 4:
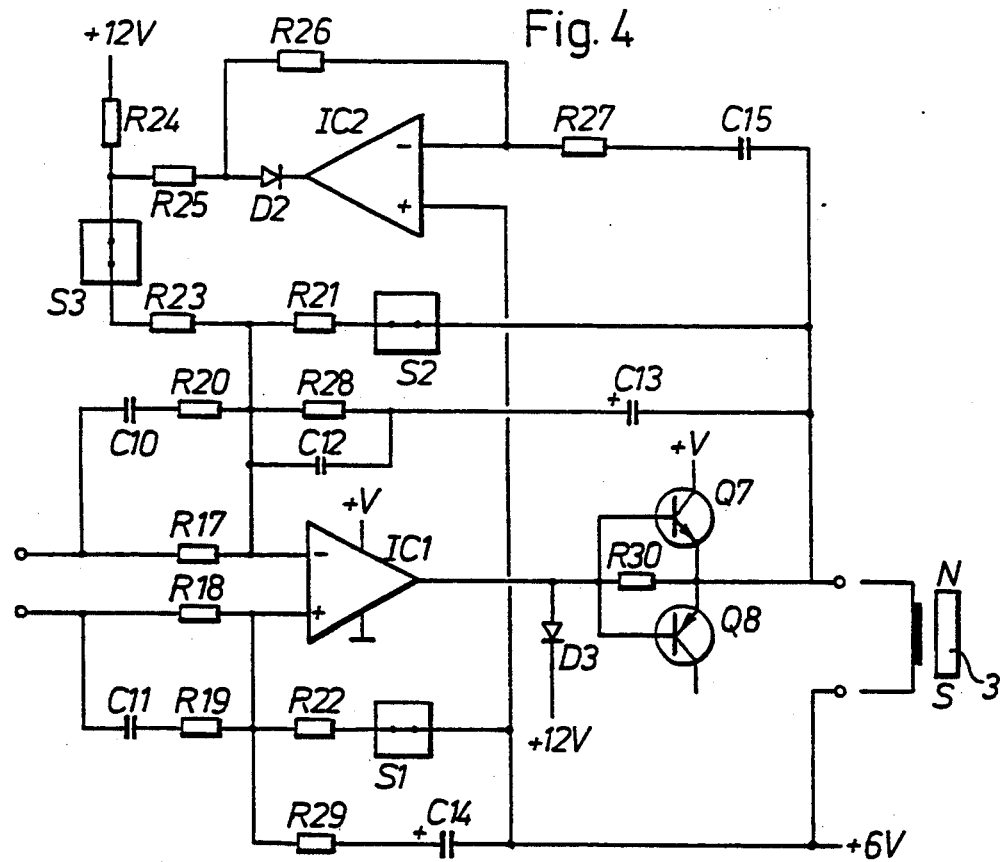
FIG. 4 is a terminal diagram of the error amplifier.

As mentioned above, suitable amplification of the signals from the detectors is arranged to provide the drive to the adjusting means. A terminal diagram of an example of an error amplifier is to be found in FIG. 4. As will be understood, the circuit of FIG. 4 is connected to that in FIG. 2 at the points $F_1$ and $F_2$. Accordingly, the amplifier circuit according to FIG. 4 caters for the signals from the detectors at points $F_1$ and $F_2$ and, with the aid of the adjusting means 3, pulls or pushes the tuning means in the resonance module to its proper position for achieving resonance. The operational speed of the tuning means is a function of the voltage which the amplifier puts across the winding of the adjusting means. In the proposed solution, a stable 6-volt potential is used as a reference voltage for the error amplifier circuit and the adjusting means. This voltage is obtained from the voltage regulator 13 (see FIG. 1). A final step is formed by the transistors $Q_7$ and $Q_8$ and has a gain 1 and is capable of supplying all current required by the adjusting means. The error amplifier can operate in three different modes depending on the character of the output signals from the detectors 1 and 2. A logic for the switching will be described hereinbelow, but first there will now be described the different signal paths for the different modes,, with reference to FIGS. 5, 6 and 7. Mode 1 signifies that the transmitter is shut down and will be described in connection with FIG. 5. Mode 2 signifies that searching is being carried out by the signal and will be described with reference to FIG. 6. Mode 3 signifies that the signals are being supervised and will be described with reference to FIG. 7. Switching takes place by three analog switches $S_1$, $S_2$ and $S_3$ (see FIG. 4).

Figure 5:
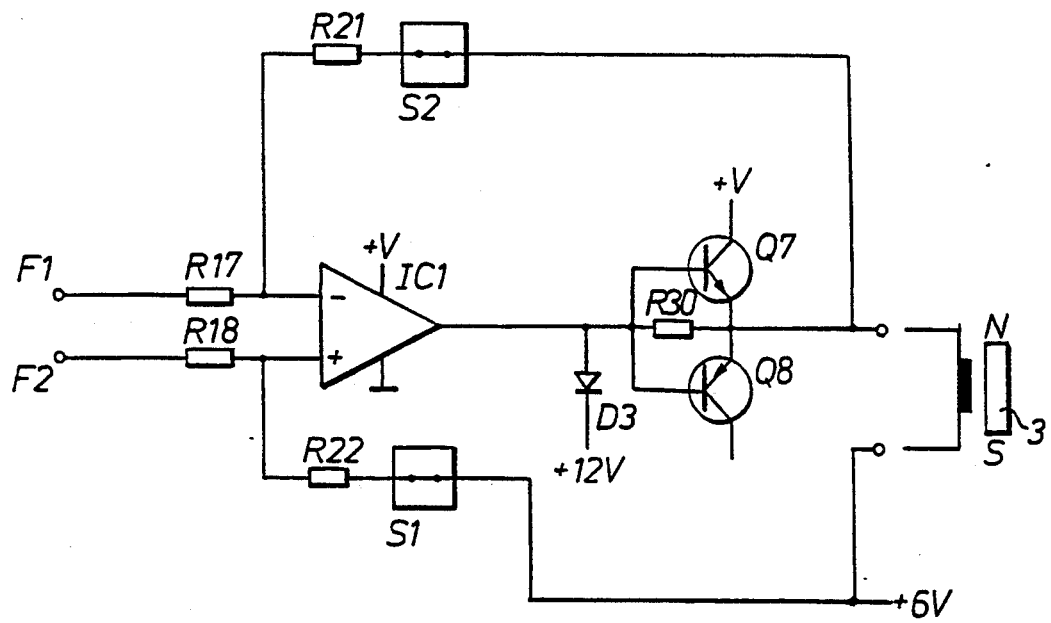
FIG. 5 is a terminal diagram of the error amplifier signal paths when the transmitter is shut down.

FIG. 5 thus shows the signal path in mode 1, i.e., with the transmitter shut down. In this state, the adjusting means never moves, i.e., the tuning means is not allowed to move and consequently the adjusting means is never fed with any voltage. If the resistors $R_{21}/R_{17}$ are in the same relationship as the resistors $R_{22}/R_{18}$ and the voltage between $F_1$ and $F_2$ is zero, this condition is met. An operation of amplifier $IC_1$ has a high differential gain and high suppression of asymmetrical voltages. If the gain of the error amplifier is low, $R_{21}/R_{17} < < 1$, a minor residue voltage between $F_1$ and $F_2$ can be tolerated due to the friction in the adjusting means. This friction can also be desirable for keeping the adjusting means resistant to small mechanical vibrations.

Figure 6:
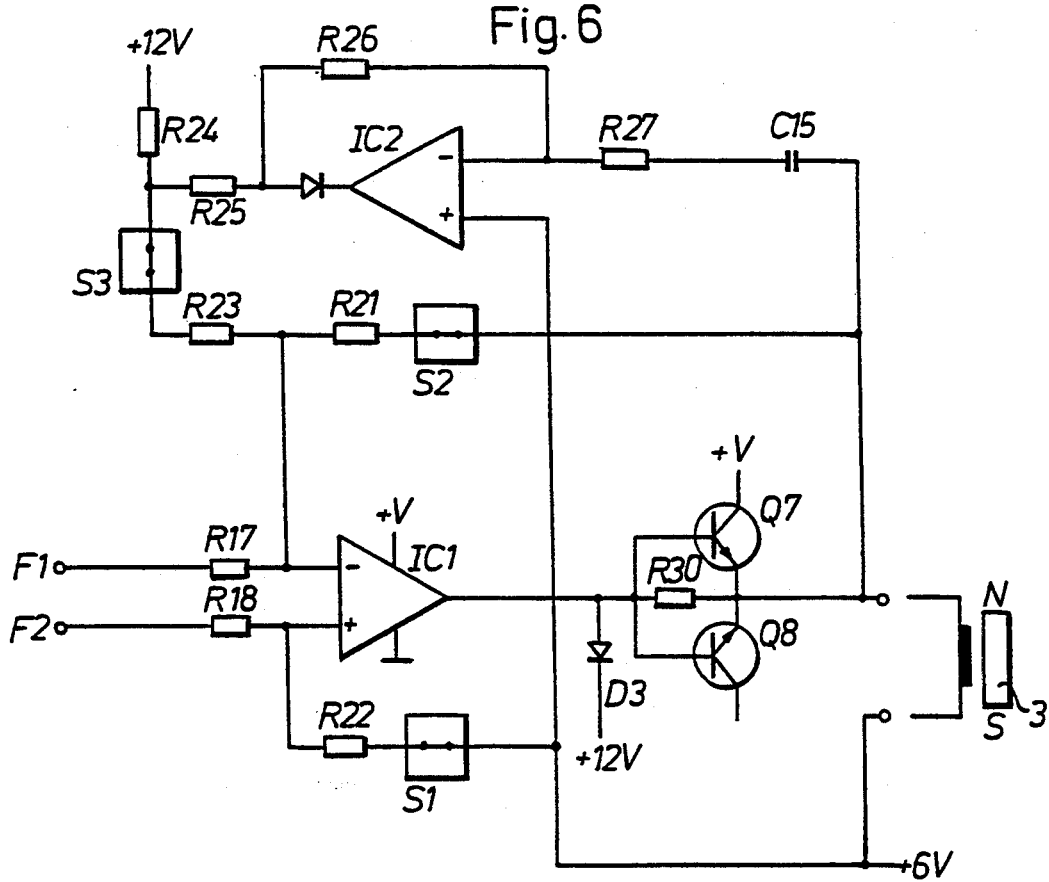
FIG. 6 illustrates the signal paths for the error amplifier during searching.

Mode 2, the signal searching mode, has its signals illustrated in FIG. 6. During searching, the tuning means must be driven at a constant rate from one end position to the other and back again. A pneumatic damper, which is built into the adjusting means, guarantees a suitable rate at the right voltage across the adjusting means. This voltage changes polarity when the direction is changed. FIG. 6 thus illustrates a possible solution to the drive problem. An operational amplifier $IC_2$ of the same type as the operational amplifier $IC_1$ according to FIG. 5 amplifies the signal across the adjusting means via a capacitor $C_{15}$ and a resistor $R_{27}$. The signal is re-fed in positive phase to the input of the operational amplifier $IC_1$. The result is an oscillator, with a frequency determined by the capacitor $C_{15}$, resistor $R_{26}$ and the amplitude across the adjusting means. In turn, the amplitude is determined by the resistors $R_{24}$, $R_{25}$, $R_{23}$ and $R_{21}$.

Figure 7:
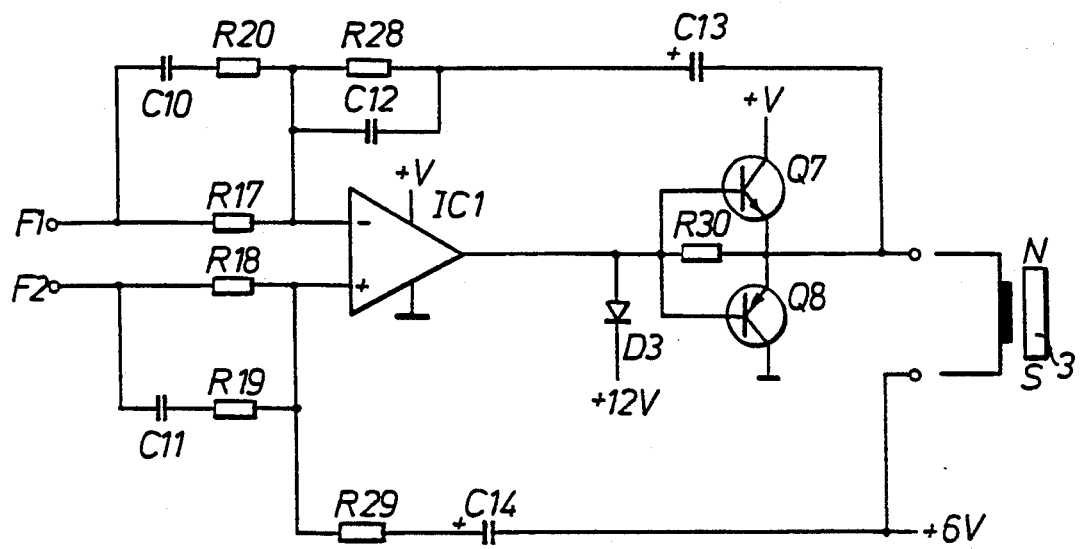
FIG. 7 is a terminal diagram of the error amplifier signal paths when the system is locked.

Mode 3 is the mode relating to accompanying the signal, and is thus illustrated in FIG. 7. When the detector 2 senses a signal of the right kind, the circuit around the operational amplifier $IC_1$ is immediately changed in accordance with what is shown in FIG. 7. It is then possible for the signal from the detector 2 between $F_1$ and $F_2$ to pass through the error amplifier and to feed the adjusting means 3 in a phase such that the plunger movement is stopped. A fine adjustment of the position takes place so that the voltage between $F_1$ and $F_2$ moves towards zero.

It is here that the circuit first justifies its designation of error amplifier. It should be observed that the capacitors $C_{13}$ and $C_{14}$ constitute an interruption for direct current so that the voltage between $F_1$ and $F_2$ is amplified in the long run by the entire gain of the operational amplifier $IC_1$, this gain being about 100,000 times. The components $C_{10}$, $C_{11}$, $R_{19}$, $R_{20}$, $C_{12}$, $R_{28}$, $R_{29}$, $C_{13}$ and $C_{14}$ give a suitable amplitude and phase sequence for different sequences, enabling the circuit according to FIG. 7 to be stable in all situations. The values of the components are determined by a series of factors, i.e., the total weight of the tuning means, its tuning range relative to its motion, friction, the power of the adjusting means for a given applied voltage, the phase sequence of the resonance cavity, the sensitivity of the detector 3, etc.

Figure 8:
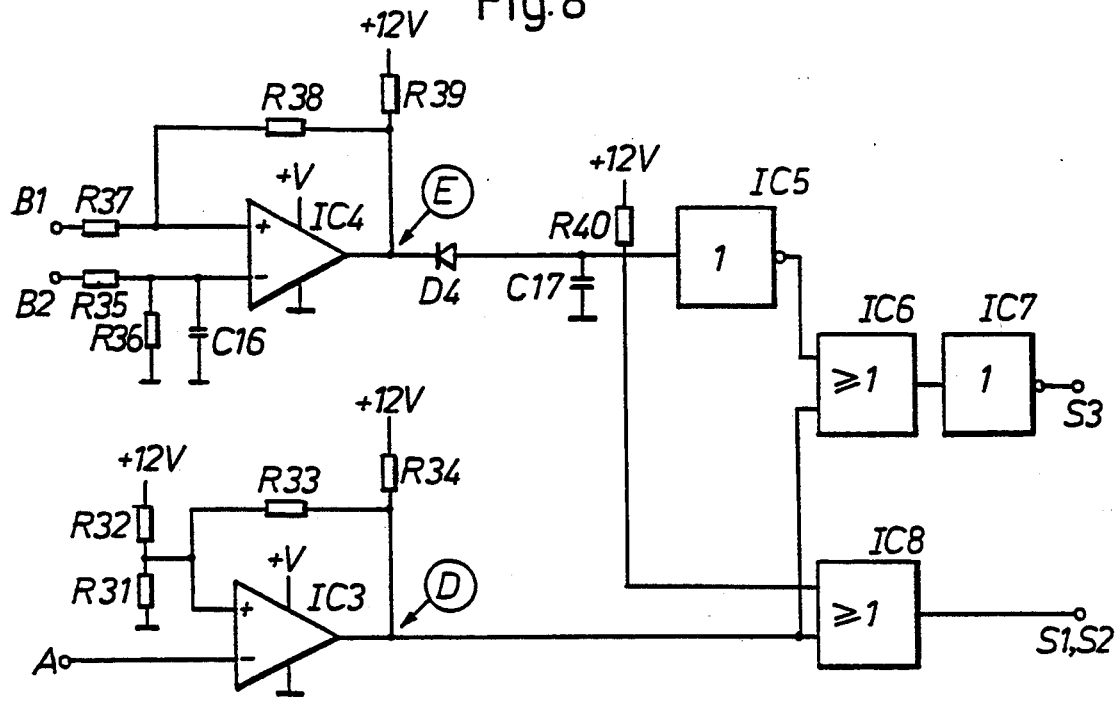
FIG. 8 is a terminal diagram for switching logic.

There is also a logical switching circuit for switching between the three previously mentioned modes. The signals from the detectors 1 and 2 must be converted to logical levels which are to control the switches $S_1$, $S_2$ and $S_3$. A possible circuit for components for this purpose is illustrated in FIG. 8. Accordingly, there are two operational amplifiers $IC_3$ and $IC_4$, and these have peripheral components functioning as decision makers for the respective signal. Levels as well as hysteresis are determined by the components around each circuit. At the points D and E, the different signal states can be read off in the form of logical 1's and 0's (high and low level). The operational amplifiers $IC_5$ and $IC_6$, $IC_7$ and $IC_8$ convert the signals at D and E according to FIG. 8 to signals for the switches $S_1$, $S_2$ and $S_3$. The components $D_4$, $R_{40}$ and $C_{17}$ form a delay circuit preventing searching from starting once again for a short overcorrection, i.e., when locking-in. The switches are on when the control voltages are high, i.e., they are 1's.

| TABLE OF LEVELS IN THE SWITCHING LOGIC | | | | |
|---|---|---|---|---|
| Mode | D | E | E for DR | $S_1$, $S_2$ | $S_3$ |
| Carrier wave form | 1 | 1 | 1 | 1 | 0 |
| Searching | 0 | 1 | 1 | 1 | 1 |
| Accompanying | 0 | 0 | 0 | 0 | 0 |
| Overcorrection | 0 | 1 | 0 | 0 | 0 |
| Distance of carrier wave | 1 | 1 | 0 | 1 | 0 |

Figure 10:
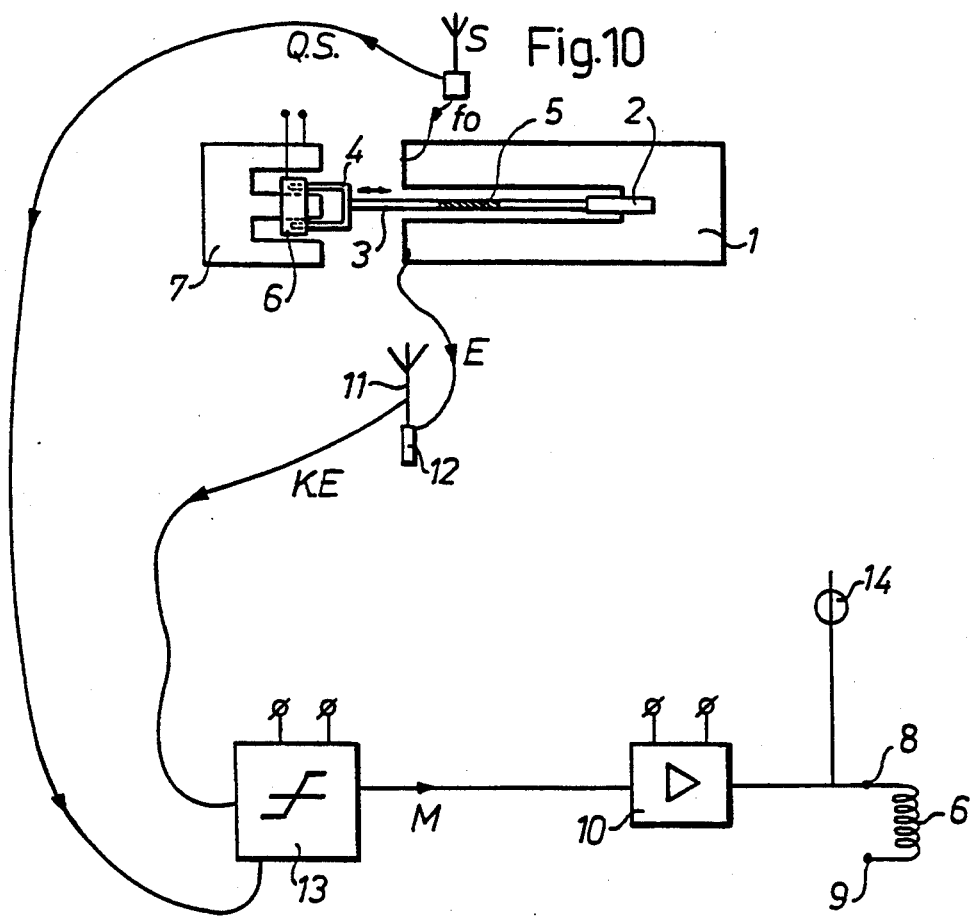
FIG. 10 schematically illustrates the system in accordance with the invention.

FIG. 10 primarily illustrates a resonance module 1. The module contains a cavity with a tuning means 2. Resonance is obtained when the tuning means has adjusted the cavity natural frequency into agreement with an input signal to the cavity. The tuning means 2 is thus moved reciprocally in the cavity in response to which natural frequency is desired for the resonance module. Operation of the tuning means 2 takes place via a rod 3 connected to an electromechanical device, which in this case comprises an electromagnet 7 and a coil 6 around the core of the electromagnet. The rod 3 is connected via a stirrup 4 to the coil. The rod has an insulator 5 separating the rod and thus the drive means from the tuning means 2. The coil 6 has two electrical terminals 8 and 9. The tuning means 2 has the form of a metal tongue, e.g., of copper or silver-plated copper, and it moves reciprocally in the cavity, which will thus be tuned to different frequencies for different positions of the tuning means in it. An input signal F to the cavity results in an output signal at the same frequency as soon as the natural frequency or resonance frequency of the cavity equals that of the input signal.

A servoamplifier 10 sends operation signals to the drive means i.e., to the coil 6 via the terminals 8 and 9. This has been illustrated schematically in FIG. 10 at the bottom to the right. The control current for the motor is formed by the voltage at the terminal 8, and this voltage can have different potentials or be plus or minus. As soon as the voltage changes, or plus is changed to minus, the moving coil 6 will change position and thereby move the rod 3 and metal tongue in the cavity. The servoamplifier 10 is fed by a current with a changing character in response to an input signal M to the server amplifier. This signal M is generated as explained below.

The output signal E from the resonance module goes to a sensing means 12 and further to an antenna 11. The output signal from the sensing means is a signal KE, which is a constant times E, and this signal is taken to a phase comparison means 13. This means operates at a radio frequency of 900 MHz or 450 MHz. Variations of these frequencies are considerable. A signal QS branched off from the input signal 1 is also taken to the phase comparison means. The phases of the signals KE and QS are compared in the phase comparison means 13 which sends the signal M as long as phase difference is present. The signal M is converted in the servoamplifier 10 to control current (voltage) which drives the electrical mechanical drive means 6, 7, which in turn moves the tuning means 2 in the cavity in the resonance module 1. The phase of the output signal KE will thus be changed and the comparison between the signals KE and QS accompany the lower graph in FIG. 2. When the phase difference is zero, there is resonance in the resonator and the output signal is at a maximum. There is no output signal M from the phase comparison means and the drive means 6, 7 stops and the tuning means 2 has arrived at the tuned-in position.

Figure 9:
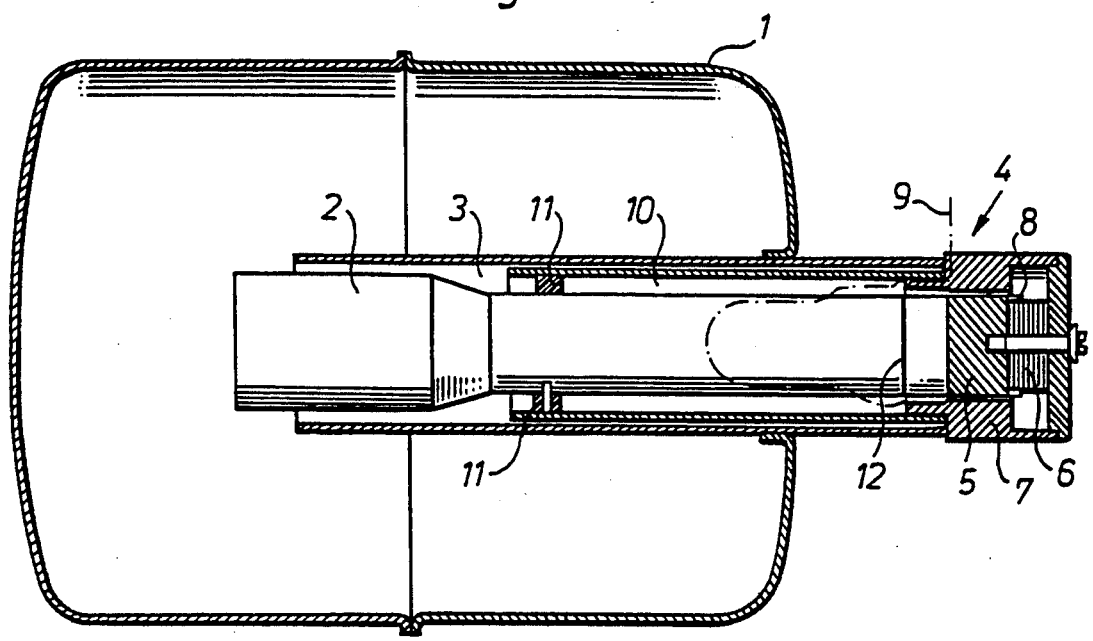
FIG. 9 is a cross-section through a resonance module and adjusting means in accordance within the invention.

A preferred embodiment of an adjusting means for the tuning means will now be described in connection with FIG. 9. The tuning means includes a chamber 1 with a tuning means 2 in the form of a metal plunger which is reciprocally movable in a cylinder chamber 3. The plunger 2 is moved with the aid of a means 4, which comprises a centrally situated iron core 5 in connection with a permanent magnet 6. Outside the iron core and permanent magnet there is an iron ring 7 concentric with these parts and having an annular gap between it and them. An electrically insulating sleeve 8 is reciprocally displaceable above the iron core 5, and carries a winding. The winding is fed with current via a very flexible long wire 9 which is not effected by the displacement of the sleeve 8. In the illustrated embodiment, the metal plunger 2 is carried by an extension 10 of the sleeve 8. The extension is mounted on support cushions 11, e.g., of nylon, and these are situated in the region of the center of gravity for the system comprising metal plunger, plunger shank and iron core.

A disc 12 is inserted in the vicinity of the iron core 5, thus forming an air space constituting a damping volume for the reciprocating movement of the sleeve about the iron core 5. The sleeve part 10 can be regarded as a piston rod which can be formed from high frequency-insulating material. Alternatively, it can be made of aluminum, and the iron core 5 is then preferably quoted with teflon. The line near supplies voltage to the winding for the purpose of driving the sleeve 8 in either direction on the iron core 5 and for achieving a resonance position for no voltage, when the adjusting means is immovable. The arrangement has the advantage that the adjusting means operates rapidly and the moving parts have low mutual friction.

The invention also relates to a method of periodically increasing the number of available frequencies in a base station. Each base station is then equipped with more resonance modules than the number corresponding to the number of necessary frequencies for normal or low telephone traffic at the base station for a given period of time. Each resonance module is tunable to the input signal by the tuning means moving in a cavity in the resonance module. If the number of frequencies of a given base station needs to be increased due to increasing local traffic intensity, the unoccupied module is tuned to frequencies which are not required in another or other base stations within the area and for the period of time of increased intensity of the base station in question. When the traffic intensity of the base station in question declines again, the frequencies are then returned to another or other base stations to suit the requirements of the traffic intensity. Tuning is carried out in accordance with the method already described.

By this procedure of loaning out frequencies from different base stations to other base stations provides the possibility, i.e., in an urban area, of providing the base station in the center of the urban area with most of the frequencies during the day time, and many more than individual base stations outside the central area. During the early morning and evening, suburban base stations require more frequencies to meet the traffic intensity, and frequencies are then transformed from the base station in the urban area center to resonance modules in base stations in the outlying areas. To carry this out, radio signals are used which each give a resonance module notification of what frequency it is to have, and tuning of the resonance module in question can take place rapidly for coming into an agreement with the input signal. The tuning means of the resonance module must thus be operated by a very rapid motor. Such a motor has been described in connection with FIG. 9.

I claim:

1. Means for use in mobile telephone systems for separately adjusting a tuning means of a cavity resonator of a base station to its own frequency which is the same as the frequency for a specific signal transmitted by said base station, said tuning means being adjusted by electro-magnetic motor means to a position in a cavity so that resonance with a frequency of the transmitting signal is obtained, said electro-magnetic motor means giving directional movement for positive voltage and reversed directional movement for negative voltage, said voltage being controlled by three detectors, said detectors including a first detector signal-connected to a receiving side of said cavity resonator and for a signal sending a voltage which determines an amount of drive voltage to said electro-magnetic motor means, a second detector signal-connected to both said receiving side and a transmitting side of said cavity resonator, said second detector comparing both signals so that, when the amplitude is the same, a signal is sent which interrupts the drive voltage to said electro-magnetic motor means and a third detector signal-connected to both said receiving side and said transmitting side of said cavity resonator for comparing the phase of said signals, such that, as long as there is a phase difference in one direction, a measuring signal being in front of or after the reference signal, a positive or negative control voltage is sent by the detector for controlling the drive voltage of said electro-magnetic motor means in a corresponding relationship.

2. Means as claimed in claim 1, wherein said third detector comprises means for phase-shifting by 90° either the signal from the receiving side of said cavity resonator or the signal from the transmitting side of said cavity resonator.

3. Means as claimed in claim 1, wherein said first detector includes a diode ($d_1$) connected to the receiving side of said resonance module, and including a resistor ($R_1$) and a capacitor ($C_1$) on the other side of said diode, said resistor ($R_1$) and said capacitor ($C_1$) having ends connected to ground.

4. Means as claimed in claim 1, whereby said second detector includes first transistor ($Q_2$) having a base connected to an input of said measuring signal via a coupling capacitor ($C_6$) to reach a collector of said transistor, a second transistor ($Q_6$) and a third transistor ($Q_5$) having bases which are connected in parallel via a filter ($C_2$, $L_1$) and a short cable to an input of said reference signal, an equal voltage being fed in parallel to collectors of said second and third transistors ($Q_5$, $Q_6$) a voltage from each collector being taken off via a resistor ($R_{15}$, $R_{16}$), said first transistor ($Q_2$) being connected by said collector of said first transistor to said second and third transistors ($Q_5$, $Q_6$) so that, when said reference signal and said measuring signal have a same phase signal, all current passing through said first transistor ($Q_2$) is connected via a resistor ($R_4$ or $R_5$) to one of the input terminals for said equal voltage, which gives rise to a voltage difference between the voltage output (at $B_1$, $B_2$) via the resistor $R_{15}$ and $R_{16}$, while for no measuring signal through said first transistor ($Q_2$) said second and third transistors ($Q_5$, $Q_6$) conduct currents of equal intensity alternatively from the voltage inputs, whereby the voltage different between the voltage outputs ($B_1$, $B_2$) becomes zero.

5. Means as claimed in claim 1, wherein said third detector includes a transistor ($Q_1$) which is fed with said measuring signal amplified by said first transistor ($Q_2$) via a capacitor ($C_7$), said measuring signal being recovered in said collector of said transistor ($Q_1$) shifted 180° in relation to said first transistor ($Q_2$) as well as two parallel transistors ($Q_3$, $Q_4$) which are supplied with reference signals with a 90° phase shift relative to the phase in said second and third transistors ($Q_5$, $Q_6$) in said second detector by the connection cable between the detectors being a quarter of a wave length, each of said parallel transistors ($Q_3$, $Q_4$) being connected by their collectors to their respective, equal feed voltage via two equal resistors ($R_2$, $R_3$), said collectors also having their individual voltage outputs ($F_1$, $F_2$) via their individual resistors ($R_{13}$, $R_{14}$), said transistor ($Q_1$) being connected by its collector to both of said parallel transistors ($Q_3$, $Q_4$), signifying that said reference signal and said measuring signal are compared and give rise either to a voltage difference between said individual voltage outputs ($F_1$, $F_2$) or to a zero voltage difference.

6. Means as claimed in claim 1, wherein control of said three detectors by said adjusting means is carried out with the aid of an amplifier which receives and amplifies signals from said three detectors.

7. Means as claimed in claim 1, wherein said electro-mechanical drive means (4) for said tuning means (1, 2,) comprises a fixed, sleeve-like part (3), dosed at one end, which centrally carries a cylindrical iron core (5) with a permanent magnet (6), an electrically insulating sleeve (8) being reciprocatingly arranged about said core (5), said sleeve carrying a winding in the region of said iron core, an end of said sleeve opposite said winding carrying a metal plunger which is reciprocatingly arranged in a cylindrical chamber (3) associated with said cavity resonator.

8. Means as claimed in claim 7, wherein said metal plunger (2) is carried by said sleeve via a piston rod (10) of high-frequency insulating material.

9. Means as claimed in claim 7, wherein said sleeve (8) contains a disc (12) adjacent said iron core (5) delimiting a damping volume for reciprocating movement of said sleeve about said iron core.

10. Means as claimed in claim 7 or 8, wherein said sleeve or said piston rod (10) is carried by support cushions (11) in the region of the center of gravity of the combination metal plunger, sleeve, winding and piston rod.

11. Means as claimed in claim 7, wherein said sleeve (8) is made of aluminum and said iron core (5) has a coating of teflon.

* * * * *